United States Patent
Toyama

(10) Patent No.: US 9,948,035 B2
(45) Date of Patent: Apr. 17, 2018

(54) CIRCUIT BOARD ASSEMBLY AND METHOD FOR MANUFACTURING THE SAME

(71) Applicant: JTEKT CORPORATION, Osaka-shi, Osaka (JP)

(72) Inventor: Yuichi Toyama, Owariasahi (JP)

(73) Assignee: JTEKT CORPORATION, Osaka (JP)

( * ) Notice: Subject to any disclaimer, the term of this patent is extended or adjusted under 35 U.S.C. 154(b) by 0 days.

(21) Appl. No.: 15/493,573

(22) Filed: Apr. 21, 2017

(65) Prior Publication Data

US 2017/0317451 A1   Nov. 2, 2017

(30) Foreign Application Priority Data

Apr. 28, 2016   (JP) ................. 2016-091393

(51) Int. Cl.
| | |
|---|---|
| H01R 12/00 | (2006.01) |
| H05K 1/00 | (2006.01) |
| H01R 13/66 | (2006.01) |
| H05K 1/18 | (2006.01) |
| H01R 24/62 | (2011.01) |
| H01R 13/506 | (2006.01) |
| H01R 43/20 | (2006.01) |
| H01R 107/00 | (2006.01) |

(52) U.S. Cl.
CPC ......... *H01R 13/665* (2013.01); *H01R 13/506* (2013.01); *H01R 24/62* (2013.01); *H01R 43/205* (2013.01); *H05K 1/181* (2013.01); *H01R 2107/00* (2013.01)

(58) Field of Classification Search
CPC .. H01R 12/716; H01R 13/5213; H01R 13/58; H01R 13/582; H01R 23/661

USPC ................. 439/76.1, 449; 361/728, 729, 730
See application file for complete search history.

(56) References Cited

U.S. PATENT DOCUMENTS

| | | | |
|---|---|---|---|
| 4,946,402 A | 8/1990 | Fink et al. | |
| 5,855,493 A * | 1/1999 | Shelly | H01R 13/516 439/465 |
| 6,293,829 B1 * | 9/2001 | Qiao | H01R 9/22 439/404 |

(Continued)

FOREIGN PATENT DOCUMENTS

| | | |
|---|---|---|
| EP | 2 061 298 A2 | 5/2009 |
| JP | 2015191995 A | 11/2015 |

OTHER PUBLICATIONS

Sep. 29, 2017 Search Report issued in European Patent Application No. 17168042.4.

*Primary Examiner* — Abdullah Riyami
*Assistant Examiner* — Thang Nguyen
(74) *Attorney, Agent, or Firm* — Oliff PLC

(57) ABSTRACT

Provided are a circuit board assembly that can prevent contact between connection terminals due to whiskers even if whiskers grow from the connection terminals and a method for manufacturing an insert molded product. A cover body of a circuit board assembly has a plurality of partition walls that form a plurality of grooves each accommodating a corresponding one of connection terminals. The partition walls restrain the inner surface of a second cover of the cover body from entering the grooves when an external pressure is applied to a part of the cover body which covers the connection terminals. The partition walls also prevent contact between adjoining ones of the connection terminals when whiskers grow.

5 Claims, 5 Drawing Sheets

(56) References Cited

U.S. PATENT DOCUMENTS

| | | | |
|---|---|---|---|
| 6,358,088 B1 | 3/2002 | Nishio et al. | |
| RE44,072 E * | 3/2013 | Milan | H01R 31/06 |
| | | | 439/171 |
| 9,368,883 B2 * | 6/2016 | Chiang | H01R 9/0506 |
| 9,462,715 B2 * | 10/2016 | Nuriya | H05K 5/061 |
| 9,543,710 B2 * | 1/2017 | Dunwoody | H01R 13/6592 |
| 9,723,734 B1 * | 8/2017 | Nishida | H05K 5/0213 |
| 2009/0129035 A1 * | 5/2009 | Kojima | H05K 5/0052 |
| | | | 361/752 |
| 2012/0015551 A1 * | 1/2012 | Tobey | H01R 9/035 |
| | | | 439/460 |
| 2012/0069532 A1 * | 3/2012 | Azumi | H05K 5/0052 |
| | | | 361/752 |
| 2013/0069320 A1 * | 3/2013 | Yanagisawa | H05K 5/0056 |
| | | | 277/628 |
| 2013/0070432 A1 * | 3/2013 | Kawai | H05K 5/0052 |
| | | | 361/752 |
| 2015/0104963 A1 * | 4/2015 | Saitoh | H01R 13/6271 |
| | | | 439/162 |
| 2015/0282362 A1 | 10/2015 | Nuriya et al. | |

* cited by examiner

CIRCUIT BOARD ASSEMBLY AND METHOD FOR MANUFACTURING THE SAME

INCORPORATION BY REFERENCE

The disclosure of Japanese Patent Application No. 2016-091393 filed on Apr. 28, 2016 including the specification, drawings and abstract, is incorporated herein by reference in its entirety.

BACKGROUND OF THE INVENTION

1. Field of the Invention

The present invention relates to circuit board assemblies and methods for manufacturing the same.

2. Description of the Related Art

A circuit board assembly having a cover that covers a circuit board having electric components is conventionally known in Japanese Patent Application Publication No. 2015-191995 (JP 2015-191995 A). In FIG. 3 of JP 2015-191995 A, the peripheral edge of a circuit board is held between wave-shaped deformed portions formed in the edges of a pair of covers, and a plurality of connection terminals for external connection are extended from the circuit board.

Conventionally, connection terminals are often plated with tin as tin is beautiful silvery white in air and has relatively low electrical resistance. However, it is known that the tin-plated connection terminals grow tin whiskers. The mechanism of tin whisker growth is as follows. In the case where the connection terminals are made of copper, a metal compound is formed between copper and tin. Since this metal compound grows along grain boundaries in the tin plating layer, the tin plating layer is locally subjected to compressive stress. Tin whiskers grow from the plating surface in order to reduce this stress. This growth of tin whiskers occurs due to recrystallization of tin, and the recrystallization temperature of tin is in a normal temperature range (0 to 25° C.).

In order to prevent such whisker growth, nickel plating etc. is performed before the tin plating so as to form an underlying nickel plating layer. In this case, however, since nickel has a higher melting point than copper, namely the material of the connection terminals, other components cannot be welded to the connection terminals (terminals). Instead of the nickel plating, annealing is performed after the tin plating in some cases.

In the case of performing tin plating on the connection terminals, an additional process or processes are required in order to prevent whisker growth. For example, nickel plating (or Cu plating) need be performed before the tin plating so as to form an underlying nickel (Cu) plating layer, or other process (e.g., annealing) need be performed after the tin plating. As in the case of the nickel plating, even if zinc plating is performed on the connection terminals, an additional process or processes are required in order to prevent zinc whisker growth.

SUMMARY OF THE INVENTION

It is one object of the present invention to provide a circuit board assembly that can prevent contact between connection terminals due to whiskers even if whiskers grow from the connection terminals and a method for manufacturing the circuit board assembly.

According to one aspect of the present invention, a circuit board assembly includes: a circuit board having an electronic component mounted thereon; a plurality of connection terminals disposed on the circuit board; and a cover body that surrounds the circuit board and the connection terminals and supports the circuit board. The cover body includes a restraining portion that forms a plurality of accommodating grooves each accommodating a corresponding one of the connection terminals. The restraining portion restrains an inner surface of the cover body from being displaced toward the accommodating grooves when an external pressure is applied to a part of the cover body which covers the connection terminals, and the restraining portion separates the connection terminals from each other to suppress contact between the connection terminals.

With the above configuration, the restraining portion on the inner surface of the cover body restrains the inner surface of the cover body from entering the accommodating grooves accommodating the connection terminals due to the external pressure and suppresses contact between the connection terminals due to whiskers that grow from the connection terminals.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
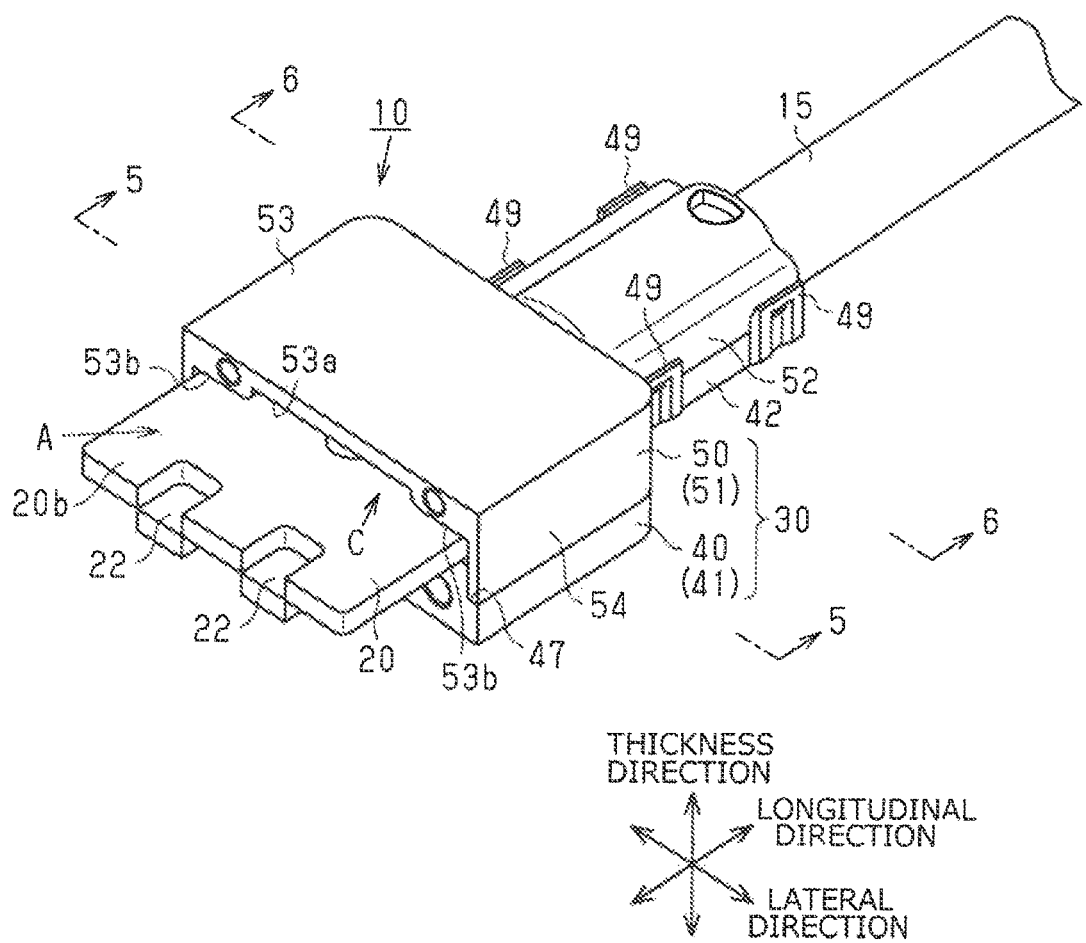
FIG. 1 is a perspective view of a circuit board assembly according to an embodiment.
Figure 2:
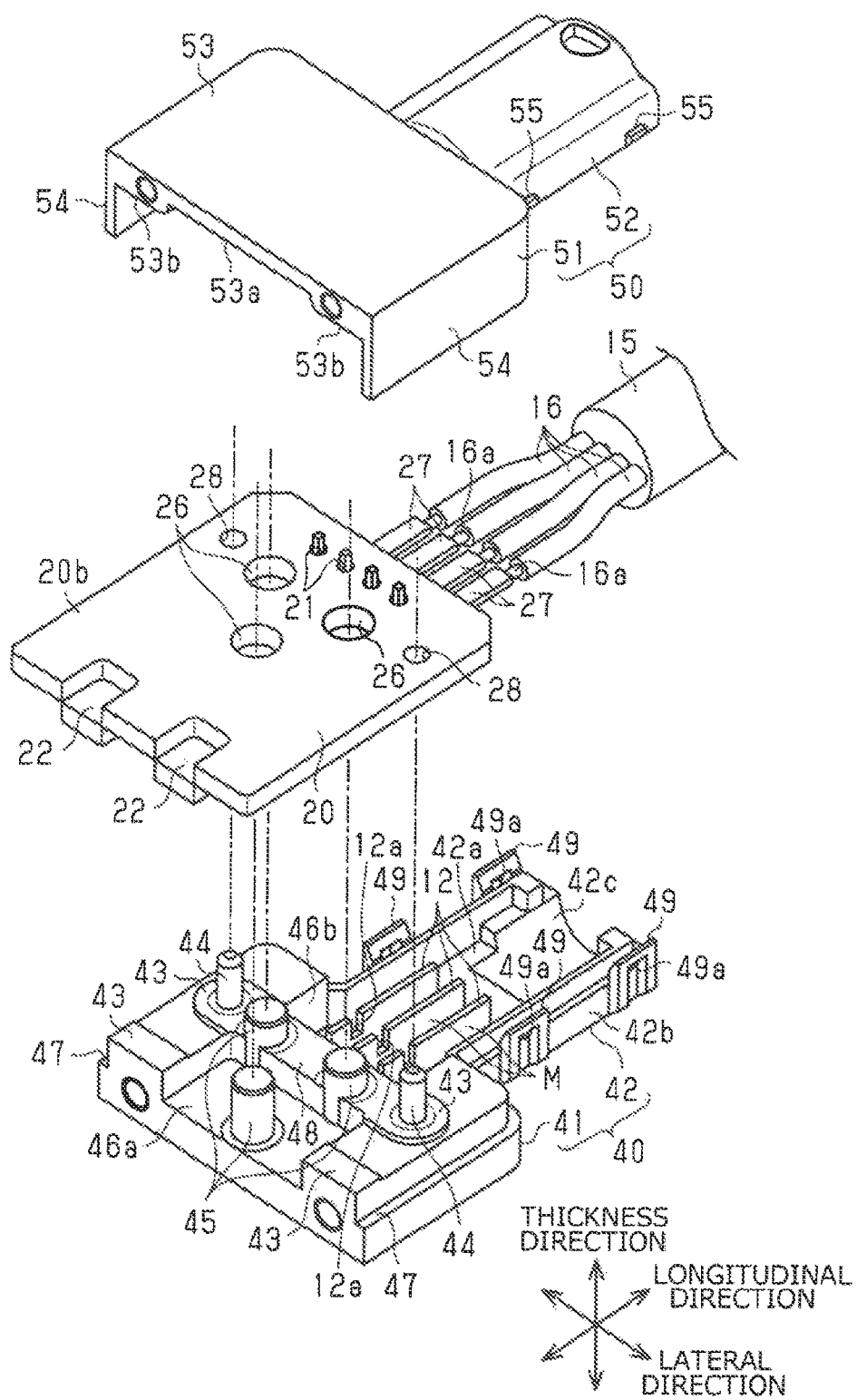
FIG. 2 is an exploded perspective view of the circuit board assembly according to the embodiment.

A circuit board assembly, a final circuit board assembly, and a method for manufacturing the final circuit board assembly according to an embodiment of the present invention will be described below with reference to FIGS. 1 to 9. As shown in FIGS. 1 and 2, a circuit board assembly 10 is formed by a circuit board 20 and a cover body 30 that covers a part of the circuit board 20.

Figure 3:
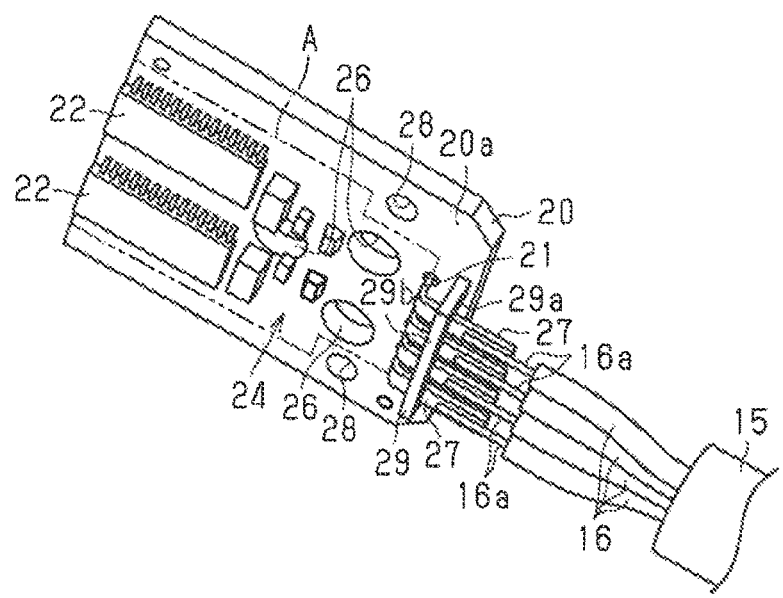
FIG. 3 is a perspective view of leads and connection terminals of a circuit board.

As shown in FIG. 2, the circuit board 20 is in the shape of a substantially quadrilateral plate and has a first flat board surface 20a (see FIG. 3) and a second flat board surface 20b. As used herein, as shown in FIG. 1, the longitudinal direction refers to the direction in which a cable 15 described below extends, and the lateral direction refers to the direction perpendicular to both the thickness direction of the circuit board 20 and the longitudinal direction. In FIG. 2, the lower surface in the thickness direction of the circuit board 20 is the first flat board surface 20a, and the upper surface in the thickness direction of the circuit board 20 is the second flat board surface 20b. As shown in FIG. 3, a plurality of sensor elements 22 are fixed to the tip end of the first flat board surface 20a so as to be arranged in the lateral direction. The first flat board surface 20a has a region A between the tip end and the base end thereof. A detection signal processing circuit 24 is placed in the region A.

A plurality of connection terminals 27 for connection to the cable 15 (see FIG. 1) are disposed on the base end side of the circuit board 20. In the present embodiment, the connection terminals 27 include a power supply connection terminal, a ground connection terminal, and detection signal output connection terminals. Each connection terminal 27 has its base end bent in an L-shape. The circuit board 20 has attachment holes 21. The connection terminals 27 are inserted through the attachment holes 21 from the first flat board surface 20a side of the circuit board 20 and are fixed to the circuit board 20 through the attachment holes 21. Those portions of the connection terminals 27 which are located on the tip end side opposite to their base ends are arranged parallel to each other so as to extend in the longitudinal direction, and the bent portion on the base end side are placed in a recess 46b, described below, in the cable terminal cover portion 42.

The connection terminals 27 are made of metal (e.g., copper) and have their surfaces plated with tin. In the present embodiment, unlike conventional examples, the connection terminals 27 do not have an underlying nickel plating layer in order to facilitate welding. Tin correspond to a metal that grows whiskers.

As shown in FIG. 3, the circuit board 20 has a holding member 29 attached to the first flat board surface 20a. The holding member 29 is made of an insulating synthetic resin. The holding member 29 has a U-shape and is formed by a pair of leg portions 29a fixed to the first flat board surface 20a and a connecting portion 29b connecting the leg portions 29a.

The holding member 29 has a plurality of holding portions, not shown, in the connecting portion 29b. The holding member 29 holds the connection terminals 27 with the holding portions such that adjacent connection terminals 27 are separated from and parallel to each other. For example, the holding portions may be through holes or fitting grooves, and the connection terminals 27 may be inserted through the through holes or fitted in the fitting grooves, etc. However, the present invention is not limited to this.

As shown in FIG. 2, a part of each coated wire 16 in the terminal of the cable 15 is a bare wire 16a having no coating. The bare wires 16a are welded to those portions of the connection terminals 27 which are extended in the longitudinal direction from the connecting portion 29b toward the opposite side from the circuit board 20.

The detection signal processing circuit 24 performs a predetermined process on detection signals of the sensor elements 22 and outputs the resultant signals to a control unit, not shown, through the detection signal output connection terminals 27 and the cable 15. For example, the sensor elements 22 are Hall elements. However, the present invention is not limited to this, and the sensor elements 22 may be other types of elements.

As shown in FIGS. 2 and 3, the circuit board 20 has a plurality of through holes 26 and a plurality of attachment holes 28. In the present embodiment, the circuit board 20 has three through holes 26. However, the number of through holes 26 need only be the same as the number of projections 45 described below. It is preferable that the through holes 26 be located near or in the region A.

As shown in FIGS. 1 and 2, the cover body 30 is formed by a first cover 40 and a second cover 50. The first cover 40 is made of an insulating synthetic resin and has a circuit board attachment portion 41 and a cable terminal cover portion 42 integrally connected to the base end of the circuit board attachment portion 41.

The circuit board attachment portion 41 is thick and is in the shape of a substantially quadrilateral plate. The first cover 40 has a recess 46a, a recess 46b, a dividing wall 48, and a cable terminal accommodating recess 42c. The recess 46a is formed in the tip end of the inner surface of the circuit board attachment portion 41 so as to open in the tip end face of the circuit board attachment portion 41. The recess 46b is formed in the base end of the inner surface of the circuit board attachment portion 41 and in the inner surface of the cable terminal cover portion 42. The dividing wall 48 is formed between the recesses 46a, 46b. The recess 46b communicates with the cable terminal accommodating recess 42c formed in the inner surface of the cable terminal cover portion 42.

The circuit board attachment portion 41 and the cable terminal cover portion 42 have an engagement stepped portion 47 in their both outer surfaces in the lateral direction. The circuit board attachment portion 41 has a plurality of board mount portions 43 on its surface facing the second cover 50. Specifically, a plurality of board mount portions 43 are formed side by side in the lateral direction on this surface of the circuit board attachment portion 41 at positions close to the tip end of the circuit board attachment portion 41, and a plurality of board mount portions 43 are further formed side by side in the lateral direction on this surface of the circuit board attachment portion 41 at positions around the middle of the circuit board attachment portion 41. Although two board mount portions 43 are formed side by side in the lateral direction in the present embodiment, the present invention is not limited to this.

The circuit board 20 is mounted on the board mount portions 43. Each of the plurality of board mount portions 43 formed at the positions around the middle of the circuit board attachment portion 41 has an attachment projection 44 projecting toward the opposing inner surface of the second cover 50. The attachment projections 44 extend through the attachment holes 28 of the circuit board 20.

Although not shown in the figures, the tip ends of the attachment projections 44 extending through the circuit board 20 are heated and melted so as to cover the attachment holes 28 and the peripheral edges thereof. Therefore, the melted tip ends of the attachment projections 44 are solidified and thus welded to the second flat board surface 20b of the circuit board 20 which faces the second cover 50. The circuit board 20 is attached and fixed to the circuit board attachment portion 41 by this welding.

As shown in FIG. 1, the circuit board 20 is thus attached to the circuit board attachment portion 41 so that substantially a longitudinal half of the circuit board 20 projects from the circuit board attachment portion 41. That is, a part of the region A which is located on the tip end side of the circuit board 20 is exposed from the circuit board attachment portion 41. The other half of the circuit board 20 which includes the remaining part of the region A faces the inner surface of the circuit board attachment portion 41.

The circuit board attachment portion 41 has a plurality of projections 45. The projections 45 are formed so as to extend through the through holes 26 of the circuit board 20 and contact the inner wall surface (i.e., the inner surface) of the second cover 50 described below (see FIG. 5), or are formed so as to extend through the through holes 26 of the circuit board 20 to a position immediately before the inner wall surface of the second cover 50. In the present embodiment, the projections 45 includes a projection 45 projecting from the inner surface of the recess 46a and projections 45 projecting from the dividing wall 48, and the projections 45 are formed at positions corresponding to the through holes 26 of the circuit board 20 that is fixed to the circuit board attachment portion 41.

The number of projections 45 is not limited to two or more and may be one. It is preferable that the projections 45 be located so that, if the inner wall surface of the second cover 50 is deformed by a molding pressure described below etc., the projections 45 contact the deformed inner wall surface so as not to allow the inner wall surface of the second cover 50 to interfere with electronic components on the circuit board 20.

Figure 4:
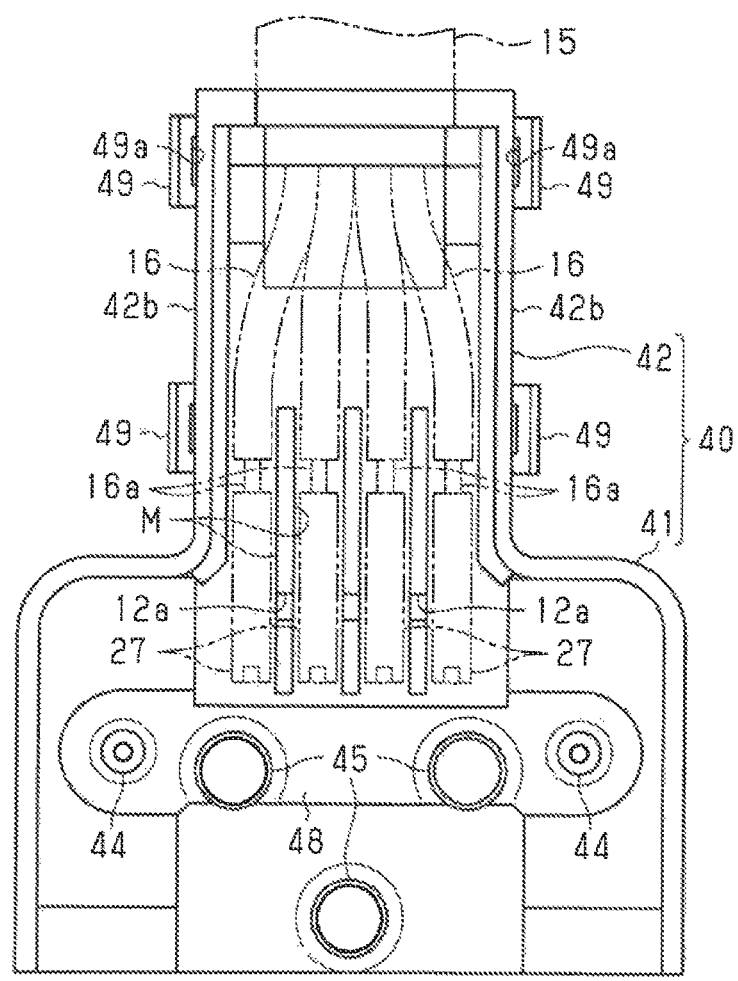
FIG. 4 is a plan view as viewed from the inside of a first cover.
Figure 6:
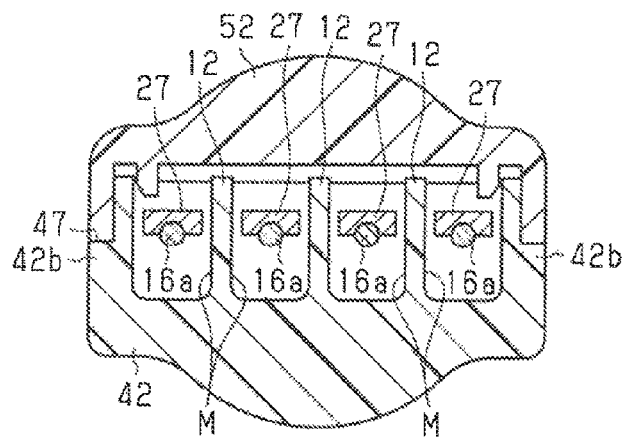
FIG. 6 is a simplified sectional view taken along line 6-6 in FIG. 1.

As shown in FIG. 2, the cable terminal cover portion 42 includes a bottom wall 42a and a pair of sidewalls 42b standing from both side edges in the lateral direction of the bottom wall 42a. The space surrounded by the bottom wall 42a and the sidewalls 42b form a part of the recess 46b. As shown in FIGS. 2 and 6, a plurality of partition walls 12 are formed on the inner bottom surface (inner surface) of the recess 46b in the circuit board attachment portion 41 and the cable terminal cover portion 42. The plurality of partition walls 12 are arranged parallel to each other at predetermined intervals in the lateral direction and project toward the second cover 50. The partition walls 12 are also extended toward the cable 15 in the longitudinal direction. Of the partition walls 12, each of the partition walls 12 adjacent to the sidewalls 42b is located at the predetermined interval from this sidewall 42b. As shown in FIGS. 4 and 6, the predetermined interval is an interval that is large enough for each connection terminal 27 to be inserted between the partition walls 12 and between the partition wall 12 and the sidewall 42b with clearance between the connection terminal 27 and each partition wall 12 and between the connection terminal 27 and the sidewall 42b.

Grooves M thus formed between the partition walls 12 and between the partition wall 12 and the sidewall 42b correspond to the accommodating grooves. As shown in FIG. 4, the partition walls 12 are formed so that their one ends on the cable 15 side (that is, their one longitudinal ends) are located closer to the cable 15 than one ends of the connection terminals 27 on the cable 15 side. The other ends on the dividing wall 48 side are located closer to the dividing wall 48 than the base ends of the connection terminals 27. The other ends on the dividing wall 48 side of the partition walls 12 may be integrally connected to the dividing wall 48.

As shown in FIG. 6, the entire surfaces of the partition walls 12 which face a cable terminal cover portion 52 of the second cover 50 are located near the inner surface of the cable terminal cover portion 52. In this case, the distance by which these surfaces of the partition walls 12 are separated from the inner surface of the cable terminal cover portion 52 is set to such a distance that the inner surface of the cable terminal cover portion 52 can contact the partition walls 12 when deformed by the molding pressure (external pressure). The entire surfaces of the partition walls 12 which face the cable terminal cover portion 52 of the second cover 50 may be in contact with the inner surface of the cable terminal cover portion 52 of the second cover 50. The partition walls 12 correspond to the restraining portion.

As shown in FIGS. 2 and 4, each partition wall 12 has a cutout 12a in its end face that faces the second cover 50. The cutout 12a is formed at a position on the circuit board attachment portion 41 side of the partition wall 12. The connecting portion 29b of the holding member 29 shown in FIG. 3 is fitted in the cutouts 12a.

As shown in FIG. 2, the second cover 50 is made of an insulating synthetic resin and has a circuit board cover portion 51 and the cable terminal cover portion 52 integrally connected to the base end of the circuit board cover portion 51.

The circuit board cover portion 51 has a top plate wall 53 in the shape of a quadrilateral plate and a sidewall 54 formed along the peripheral edge of the top plate wall 53. The sidewall 54 projects toward the circuit board attachment portion 41 from the peripheral edge of the top plate wall 53 excluding the peripheral edge of the tip end of the top plate wall 53 and the part where the circuit board cover portion 51 is connected with the cable terminal cover portion 52, and is fitted on the circuit board attachment portion 41. The tip end of the sidewall 54 contacts the engagement stepped portion 47 of the circuit board attachment portion 41.

Figure 5:
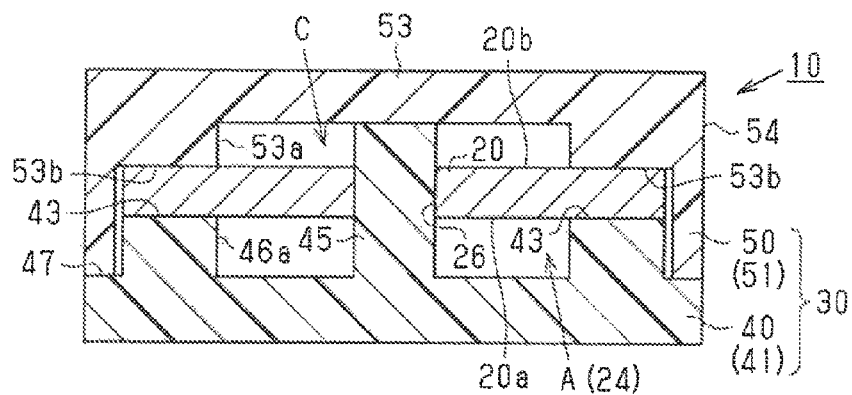
FIG. 5 is a simplified sectional view taken along line 5-5 in FIG. 1.

As shown in FIGS. 1 and 5, the top plate wall 53 has a pair of recesses 53a formed on the tip end side and the base end side of its inner surface. Only the recess 53a on the tip end side is shown in FIG. 2. The pair of recesses 53a are separated from each other by a dividing wall, not shown. The recess 53a on the base end side, not shown, communicates with a cable terminal accommodating recess, not shown, formed in the inner surface of the cable terminal cover portion 52. As shown in FIG. 2, the recess 53a on the tip end side opens in the tip end face of the circuit board cover portion 51 and is placed so as to face the recess 46a of the circuit board attachment portion 41.

Figure 8:
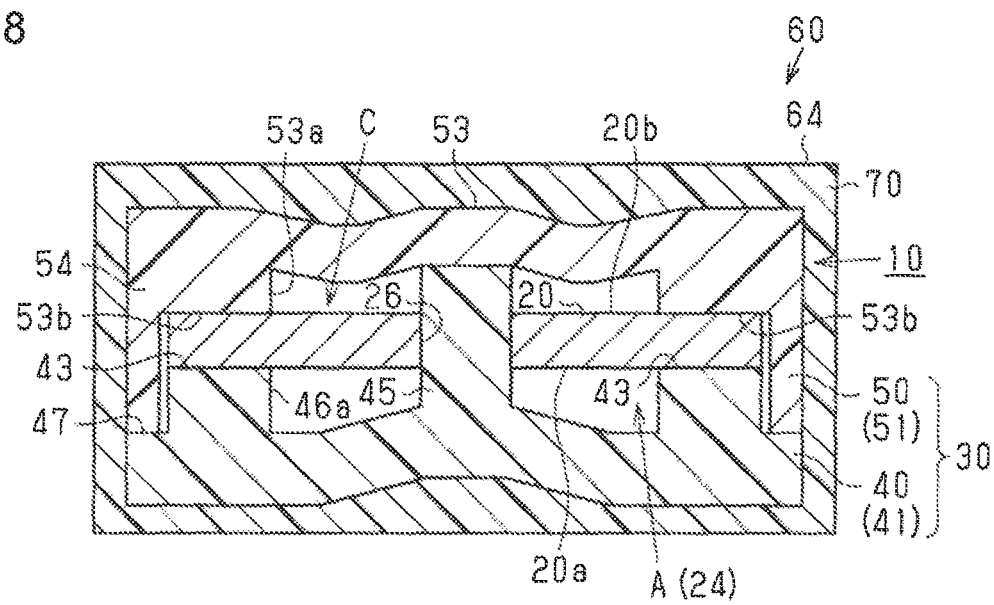
FIG. 8 is a simplified sectional view taken along line 8-8 in FIG. 7.

As shown in FIGS. 1 and 8, the space formed by the inner surface of the circuit board attachment portion 41 (excluding the engagement stepped portion 47) and the inner surface of the top plate wall 53 (excluding the end face of the sidewall 54 which engages with the engagement stepped portion 47) so that the inner surfaces of the circuit board attachment portion 41 and the top plate wall 53 face each other includes the recesses 46a, 53a and the spaces formed between each board mount portion 43 and a portion 53b of the top plate wall 53 which faces the board mount portion 43.

The recesses 46a, 53a and these spaces form an accommodating chamber C that accommodates a part of the circuit board 20. In the present embodiment, the accommodating chamber C is surrounded by the top plate wall 53 and the sidewall 54 of the circuit board cover portion 51 and the portions forming the inner surface of the circuit board attachment portion 41.

As shown in FIG. 1, the cable terminal cover portion 42 and the cable terminal cover portion 52 are placed on top of each other so as to face each other. That is, as shown in FIG. 2, the cable terminal cover portion 42 has a plurality of engagement portions 49 on its both sidewalls 42b in the lateral direction, and the cable terminal cover portion 52 has a plurality of lock members 55 on its both side portions in the lateral direction. Each engagement portion 49 has an engagement hole 49a. As shown in FIG. 1, as the lock members 55 engage with the engagement holes 49a, the cable terminal cover portion 52 and the cable terminal cover portion 42 cannot be separated from each other. In this state, the terminal of the cable 15 is accommodated in the cable terminal accommodating recess 42c etc. formed in the cable terminal cover portions 42, 52.

A method for manufacturing a final circuit board assembly by using the circuit board assembly 10 thus formed as an insert will be described below.

The circuit board assembly 10 is placed in a mold, not shown, and the mold is clamped. In the clamped state, the part of the circuit board 20 which is exposed from the cover body 30 in the circuit board assembly 10 as shown in FIG. 1 is covered by a cover member, not shown, of the mold so that this part of the circuit board 20 is not exposed to a filling resin (synthetic resin) described below.

The synthetic resin (hereinafter referred to as the "coating resin 70") melted by heating is injected from an injection unit, not shown, into a cavity of the mold. The cavity is thus filled with the coating resin 70 and the pressure is maintained. Insert molding is thus performed.

When the cavity is filled with the coating resin 70, a molding pressure is applied to the outer surface of the circuit board assembly 10. As shown in FIG. 8, the top plate wall 53 and the circuit board attachment portion 41 are deformed inward, namely toward the circuit board 20, by this molding pressure (external pressure). When such deformation occurs, the projections 45 of the circuit board attachment portion 41 contact the inner surface of the top plate wall 53 to restrain deformation of the top plate wall 53 toward the circuit board 20.

Figure 9:
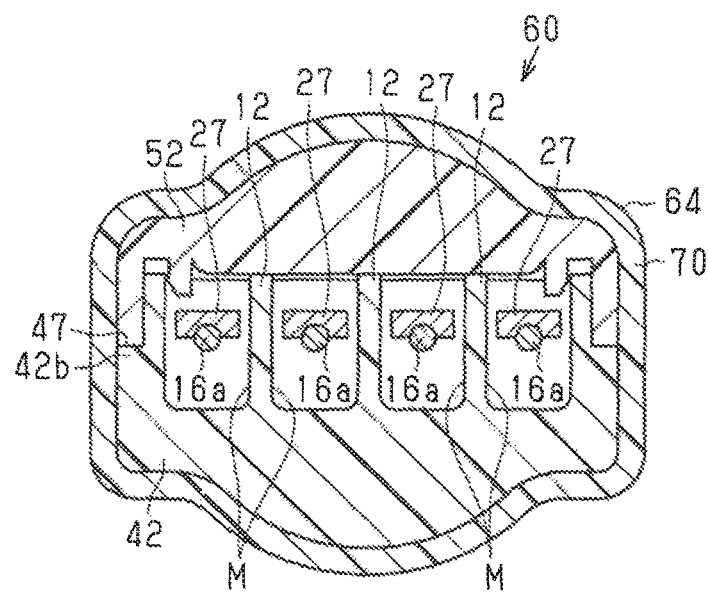
FIG. 9 is a simplified sectional view taken along line 9-9 in FIG. 7.

As shown in FIG. 9, the cable terminal cover portions 42, 52 are also deformed inward by this molding pressure (external pressure) so that the partition walls 12 contact the inner surface of the cable terminal cover portion 52. In the case where the partition walls 12 are formed so as to be in contact with the inner surface of the cable terminal cover portion 52, the inner surface of the cable terminal cover portion 52 more closely contacts the partition walls 12 and is deformed by the molding pressure (external pressure).

Since the entire surfaces of the partition walls 12 which face the cable terminal cover portion 52 thus contact the inner surface of the cable terminal cover portion 52, the grooves M serving as spaces accommodating the connection terminals 27 are separated from each other by the partition walls 12.

Figure 7:
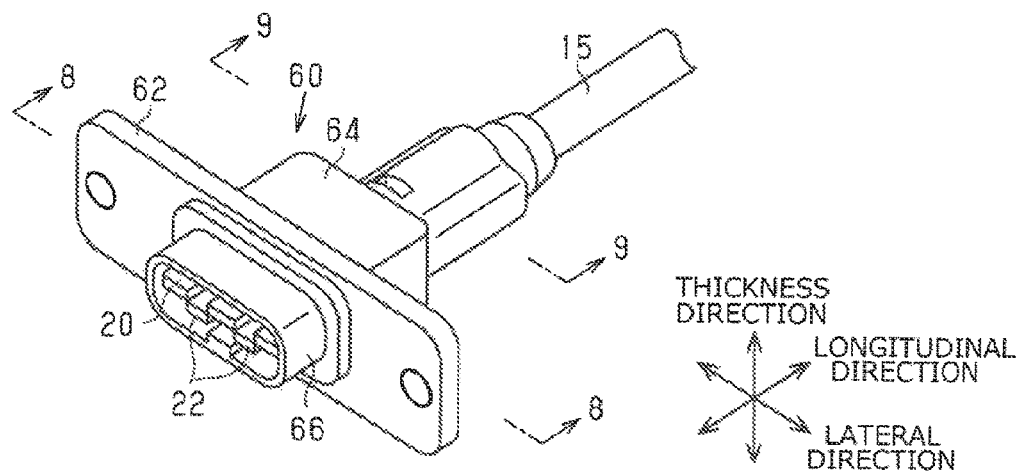
FIG. 7 is a perspective view of a final circuit board assembly according to an embodiment.

After the coating resin 70 in the cavity is cooled, the mold is opened. A final circuit board assembly 60 shown in FIG. 7 is thus produced. In the example of FIG. 7, a molded body 64 having a flange 62 is formed on the entire cover body 30 of the circuit board assembly 10. The molded body 64 further has a tubular portion 66 that covers the exposed part of the circuit board 20 in the circuit board assembly 10. The tubular portion 66 has an elongated circular section and is open in its tip end. The molded body 64 corresponds to the external structure.

Functions of the present embodiment will be described. In the case where the final circuit board assembly 60 is produced by using the circuit board assembly 10 configured as described above as an insert, the cable terminal cover portions 42, 52 are deformed inward and the partition walls 12 contact the inner surface of the cable terminal cover portion 52, as shown in FIG. 9. The grooves M serving as spaces accommodating the connection terminals 27 are therefore separated from each other by the partition walls 12. Accordingly, even if tin whiskers grow from the connection terminals 27, contact between the connection terminals 27 due to the tin whiskers can be prevented.

The present embodiment has the following advantageous effects.

(1) In the circuit board assembly 10 of the present embodiment, the cover body 30 has the partition walls 12 (restraining portion) that form the plurality of grooves M (accommodating grooves) each accommodating a corresponding one of the connection terminals 27. The partition walls 12 (restraining portion) restrain the inner surface of the cover body 30 from being displaced toward the grooves M (accommodating grooves) when an external pressure is applied to the part of the cover body 30 which covers the connection terminals 27. Moreover, the partition walls 12 separate the connection terminals 27 from each other to prevent contact between the connection terminals 27. Accordingly, even if whiskers grow from the connection terminals 27 in the circuit board assembly 10, contact between the connection terminals 27 due to the whiskers can be prevented. In the present embodiment, since no nickel plating is performed on the connection terminals 27, other components to be connected to the connection terminals 27 can be easily welded to the connection terminals 27.

(2) In the final circuit board assembly 60 of the present embodiment, the cover body 30 includes the first cover 40 that covers the first flat board surface 20a of the circuit board 20 and the second cover 50 that covers the second flat board surface 20b of the circuit board 20, and the partition walls 12 (restraining portion) that project from the first cover 40 toward the second cover 50. With this configuration, the partition walls 12 (restraining portion) projecting from the first cover 40 can prevent contact between the connection terminals 27 due to whiskers that grow from the connection terminals 27.

(3) The final circuit board assembly 60 of the present embodiment uses the circuit board assembly 10 as an insert and has the molded body 64 (the external structure made of synthetic resin) on the outer surface of the cover body 30 in the circuit board assembly 10. The cover body 30 has on its inner surface the partition walls 12 (restraining portion) that restrain the inner surface of the cover body 30 from entering the grooves M (accommodating grooves). Accordingly, even if whiskers grow from the connection terminals 27 containing a metal that grows whiskers in the final circuit board assembly 60, contact between the connection terminals 27 due to the whiskers can be prevented.

(4) In the method for manufacturing the circuit board assembly according to the present embodiment, the partition walls 12 (restraining portion) projecting into the grooves M (accommodating grooves) are formed on the inner surface of the cover body 30, and the partition walls 12 restrain the inner surface of the cover body 30 from being partially deformed toward the grooves M by a molding pressure when the molded body 64 (the external structure made of synthetic resin) is formed on the outer surface of the cover body 30 by insert molding.

The circuit board assembly is thus obtained in which the partition walls 12 restrain the inner surface of the cover body 30 from entering the grooves M when an external pressure (i.e., a molding pressure) is applied to the cover body 30 during insert molding of the external structure, and which prevents contact between the connection terminals 27 due to whiskers that grow from the connection terminals 27.

The above embodiment may be modified as follows. In the above embodiment, tin is used as a metal that grows whiskers. However, the metal that grows whiskers may be metal other than tin such as zinc, gold, or silver. That is, the tin-plated connection terminals in the configuration of the above embodiment may be replaced with connection terminals plated with zinc, gold, silver, etc.

In the above embodiment, the circuit board assembly 10 is used as an insert for the final circuit board assembly 60. However, the circuit board assembly 10 may be used as a final circuit board assembly instead of using the circuit board assembly 10 as an insert. In the above embodiment, the partition walls serving as the restraining portion are formed in the first cover 40. However, the partition walls may be formed in the second cover 50.

The partition walls 12 of the first cover 40 in the above embodiment may have a reduced height, and partition walls that have a height corresponding to the reduction in height of the partition walls 12 and that contact the partition walls 12 of the first cover 40 may be formed on the second cover 50. That is, the partition walls serving as the restraining portion may be formed on both the first cover 40 and the second cover 50 so that the partition walls of the first cover 40 face the partition walls of the second cover 50 and so that the partition walls of the first cover 40 contact the partition walls of the second cover 50 when the circuit board assembly 10 is formed.

Although a single circuit board 20 is used in the above embodiment, a plurality of circuit boards may be arranged side by side. Representative examples of the electronic components herein include the following elements. However, the present invention is not limited to these elements.

Examples of active elements include a semiconductor device, a transistor, an integrated circuit, and a diode. Examples of passive elements include a resistor, a capacitor, a coil, a transformer, a relay, a piezoelectric element, and an oscillator. Examples of mechanism components include a connector, a socket, a plug, a switch, a fuse, a heat sink, and an antenna.

Examples of circuits include a control circuit, a sensor circuit, and a connection circuit (connection terminal).

What is claimed is:

1. A circuit board assembly, comprising:
    a circuit board having an electronic component and a holding member mounted on the circuit board;
    a plurality of connection terminals disposed on the circuit board, wherein the holding member holds the connection terminals with holding portions such that adjacent connection terminals are separated from and parallel to each other;
    a cover body that surrounds the circuit board and the connection terminals and supports the circuit board, wherein
    the cover body includes a restraining portion that forms a plurality of partition walls arranged parallel to each other and a plurality of accommodating grooves each accommodating a corresponding one of the connection terminals, an accommodating groove of the plurality of accommodating grooves being formed between the partition walls,
    each of the plurality of partition walls has a cutout, of a plurality of cutouts, formed in each partition wall, and a connecting portion of the holding member is fitted in each of the plurality of cutouts,
    the restraining portion restrains an inner surface of the cover body from being displaced toward the accommodating grooves when an external pressure is applied to a part of the cover body which covers the connection terminals, and
    the restraining portion separates the connection terminals from each other to suppress contact between the connection terminals.

2. The circuit board assembly according to claim 1, wherein
    the cover body includes a first cover that covers a first surface of the circuit board and a second cover that covers a second surface of the circuit board, and
    the restraining portion projects from at least one of the first and second covers toward the other.

3. The circuit board assembly according to claim 1, further comprising:
    an external structure made of synthetic resin and covering an outer surface of the cover body in the circuit board assembly, wherein
    the cover body has, on its inner surface, the restraining portion that restrains the inner surface of the cover body from being displaced toward the accommodating grooves.

4. The circuit board assembly according to claim 1, wherein the holding member is formed by a pair of leg portions fixed to a surface of the circuit board and the connecting portion, which connects the leg portions.

5. A method for manufacturing a final circuit board assembly including a circuit board having an electronic component and a holding member mounted on the circuit board, a connection terminal disposed on the circuit board, wherein the holding member holds the connection terminal, and a cover body that is made of a synthetic resin, that surrounds the circuit board and the connection terminal and supports the circuit board, and that has an accommodating groove accommodating the connection terminal, an outer surface of the cover body being covered by an external structure made of synthetic resin, comprising:
    placing, as an insert, the cover body containing the circuit board into a mold; and
    insert molding the external structure made of synthetic resin around the outer surface of the cover body containing the circuit board, wherein,
    an inner surface of the cover body has a restraining portion projecting toward the accommodating groove and forming partition walls arranged parallel to each other, the accommodating groove being formed between the partition walls,
    each of the partition walls has a cutout, of a plurality of cutouts, formed in each partition wall, and a connecting portion of the holding member is fitted in each of the cutouts, and
    the restraining portion restrains the inner surface of the cover body from being displaced toward the accommodating groove by a molding pressure when the external structure is insert molded.

* * * * *